(12) United States Patent
Hsu et al.

(10) Patent No.: US 8,860,135 B2
(45) Date of Patent: Oct. 14, 2014

(54) SEMICONDUCTOR STRUCTURE HAVING ALUMINUM LAYER WITH HIGH REFLECTIVITY

(75) Inventors: Chi-Mao Hsu, Tainan (TW); Hsin-Fu Huang, Tainan (TW); Min-Chuan Tsai, New Taipei (TW); Chien-Hao Chen, Yun-Lin County (TW); Wei-Yu Chen, Tainan (TW); Chin-Fu Lin, Tainan (TW); Jing-Gang Li, Singapore (SG); Min-Hsien Chen, Hsinchu County (TW); Jian-Hong Su, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/401,788

(22) Filed: Feb. 21, 2012

(65) Prior Publication Data

US 2013/0214336 A1 Aug. 22, 2013

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 23/48* | (2006.01) | |
| *H01L 23/52* | (2006.01) | |
| *H01L 29/40* | (2006.01) | |

(52) U.S. Cl.
USPC ........... 257/337; 257/330; 257/334; 257/335; 257/758; 257/765; 257/771; 257/E21.577; 257/E21.585; 257/E29.261

(58) Field of Classification Search
USPC .......... 257/758, 765, 771, E21.577, E21.585, 257/330, 334, 335, 337, E29.261
See application file for complete search history.

(56) References Cited

U.S. PATENT DOCUMENTS

| | | | | |
|---|---|---|---|---|
| 5,384,729 A | * | 1/1995 | Sameshima | 365/145 |
| 5,424,238 A | * | 6/1995 | Sameshima | 438/3 |
| 5,466,636 A | * | 11/1995 | Cronin et al. | 438/392 |
| 5,478,758 A | * | 12/1995 | Easter | 438/402 |
| 5,516,625 A | * | 5/1996 | McNamara et al. | 430/314 |
| 5,667,853 A | * | 9/1997 | Fukuyoshi et al. | 428/1.62 |
| 5,801,427 A | * | 9/1998 | Shiratake et al. | 257/412 |
| 5,892,282 A | | 4/1999 | Hong | |
| 6,005,649 A | * | 12/1999 | Krusius et al. | 349/73 |
| 6,063,703 A | * | 5/2000 | Shinriki et al. | 438/653 |
| 6,096,659 A | | 8/2000 | Gardner | |
| 6,177,303 B1 | | 1/2001 | Schmitz | |
| 6,278,164 B1 | * | 8/2001 | Hieda et al. | 257/410 |
| 6,303,418 B1 | | 10/2001 | Cha | |
| 6,458,684 B1 | | 10/2002 | Guo | |
| 6,515,338 B1 | * | 2/2003 | Inumiya et al. | 257/368 |

(Continued)

*Primary Examiner* — Ida M Soward

(74) *Attorney, Agent, or Firm* — Winston Hsu; Scott Margo

(57) ABSTRACT

A method for filling a trench with a metal layer is disclosed. A deposition apparatus having a plurality of supporting pins is provided. A substrate and a dielectric layer disposed thereon are provided. The dielectric layer has a trench. A first deposition process is performed immediately after the substrate is placed on the supporting pins to form a metal layer in the trench, wherein during the first deposition process a temperature of the substrate is gradually increased to reach a predetermined temperature. When the temperature of the substrate reaches the predetermined temperature, a second deposition process is performed to completely fill the trench with the metal layer. The present invention further provides a semiconductor device having an aluminum layer with a reflectivity greater than 1, wherein the semiconductor device is formed by using the method.

5 Claims, 6 Drawing Sheets

(56) References Cited

U.S. PATENT DOCUMENTS

| | | |
|---|---|---|
| 6,573,134 B2 | 6/2003 | Ma |
| 6,660,135 B2 | 12/2003 | Yu |
| 6,887,747 B2 * | 5/2005 | Yagishita et al. ............. 438/197 |
| 6,913,942 B2 * | 7/2005 | Patel et al. ...................... 438/48 |
| 6,930,028 B1 * | 8/2005 | Hanratty et al. ............. 438/585 |
| 6,960,416 B2 | 11/2005 | Mui |
| 6,964,893 B2 * | 11/2005 | Matsuo ......................... 438/199 |
| 7,126,199 B2 | 10/2006 | Doczy |
| 7,144,783 B2 | 12/2006 | Datta |
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,217,611 B2 | 5/2007 | Kavalieros |
| 7,355,281 B2 | 4/2008 | Brask |
| 7,407,876 B2 | 8/2008 | Ishizaka |
| 7,554,154 B2 * | 6/2009 | Hebert .......................... 257/340 |
| 7,556,998 B2 | 7/2009 | Park |
| 7,696,031 B2 * | 4/2010 | Shimomura et al. .......... 438/166 |
| 7,700,479 B2 | 4/2010 | Huang |
| 7,776,680 B2 * | 8/2010 | Basker et al. ................. 438/231 |
| 7,871,915 B2 * | 1/2011 | Lim et al. ...................... 438/592 |
| 7,892,911 B2 * | 2/2011 | Wood et al. ................... 438/206 |
| 8,053,320 B2 * | 11/2011 | Hayashi et al. ............... 438/289 |
| 2002/0024119 A1 * | 2/2002 | Tanaka et al. ................. 257/649 |
| 2002/0119630 A1 * | 8/2002 | Ueda ............................. 438/301 |
| 2003/0076467 A1 * | 4/2003 | Wang ............................. 349/115 |
| 2005/0023133 A1 * | 2/2005 | Lippitt et al. ............ 204/192.25 |
| 2006/0024953 A1 | 2/2006 | Papa Rao |
| 2007/0145591 A1 | 6/2007 | Yano |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0087055 A1 | 4/2010 | Lai |
| 2010/0124818 A1 | 5/2010 | Lee |
| 2010/0244141 A1 | 9/2010 | Beyer |

* cited by examiner

US 8,860,135 B2

SEMICONDUCTOR STRUCTURE HAVING ALUMINUM LAYER WITH HIGH REFLECTIVITY

BACKGROUND OF THE INVENTION

1. Field of the Invention

The present invention relates to a method for filling a trench with a metal layer and a semiconductor structure formed by using the same, and more particularly, to a method including at least two deposition processes for filling a trench with a metal layer and a semiconductor structure formed by using the same.

2. Description of the Prior Art

Micro-processor systems comprised of integrated circuits (IC) are ubiquitous devices in modern society, being utilized in such diverse fields as automatic control electronics, mobile communication devices and personal computers. With the development of technology and the increasingly imaginative applications of electrical products, IC devices are becoming smaller, more delicate and more diversified.

Along with the miniaturization of the IC device, however, manufacturers have encountered problems related to IC fabrication methods. For example, aluminum is material commonly used for manufacturing metal gates. In a conventional gate-last process, after a dummy gate is formed, the dummy gate is removed to form a trench where aluminum is filled therein to form a metal gate. Due to the shrinkage of the device size as a consequence of device miniaturization, it is increasingly difficult to fill the aluminum into the trench. In some cases, a void may be formed within the trench. In addition, the aluminum layer formed by current deposition process has larger grain size, resulting in roughness of the surface, which is prone to spikes into the underlying barrier layer and even the work function metal layer. Consequently, the quality of the device is decreased.

SUMMARY OF THE INVENTION

The present invention therefore provides a method for filling a trench with a metal layer which can overcome the above-mentioned problems.

According to one embodiment, the present invention provides a method for filling a trench with a metal layer. A deposition apparatus having a plurality of supporting pins is provided. A substrate and a dielectric layer disposed thereon are provided. The dielectric layer has a trench. A first deposition process is performed right after the substrate is placed on the supporting pins to form a metal layer in the trench, wherein during the first deposition process a temperature of the substrate is gradually increased to a predetermined temperature. When the temperature of the substrate reaches the predetermined temperature, a second deposition process is performed to completely fill the trench with the metal layer.

According to another embodiment, the present invention provides a semiconductor structure. The semiconductor structure includes a substrate, a dielectric layer and an aluminum layer. The dielectric layer is disposed on the substrate and includes a trench. The aluminum layer is filled into the trench, wherein the reflectivity of the aluminum layer is substantially greater than 1.

The present invention provides a method including at least two deposition processes to fill the trench with the metal layer, which is able to respectively overcome the conventional problems and therefore obtain the metal layer with a better quality.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

The present invention provides a method for filling a trench with a metal layer, in which at least two deposition processes are performed. By adjusting the temperature, the supplement of heat transferring gas, and the power supply during the deposition, the metal layer can obtain a better gap filling ability.

Figure 1:
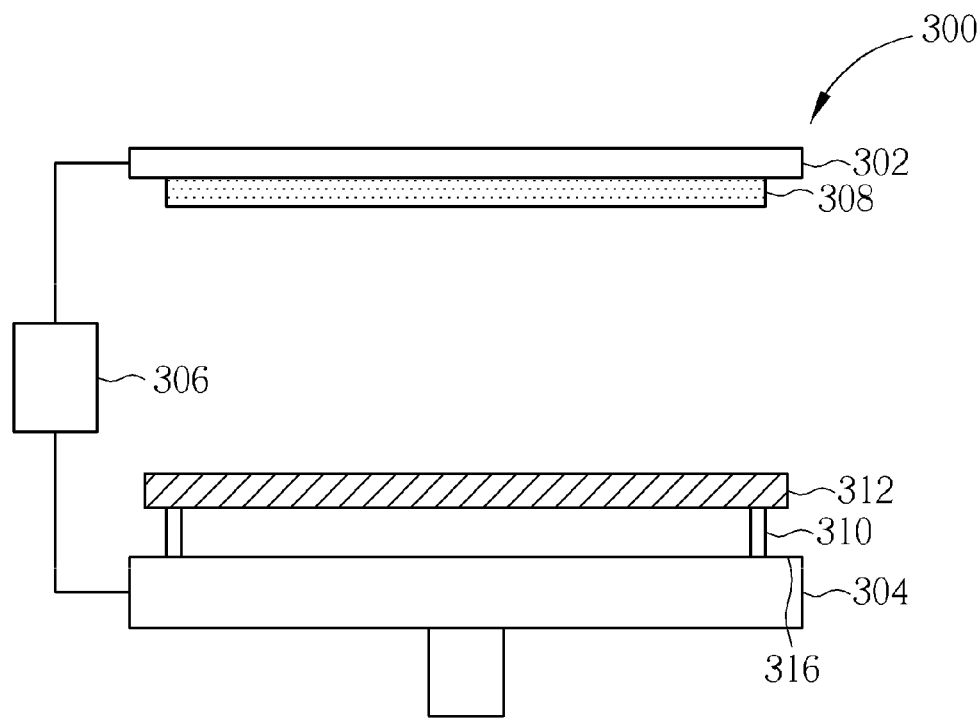
FIG. 1 and FIG. 2 are schematic diagrams of the deposition apparatus in the present invention.
Figure 2:
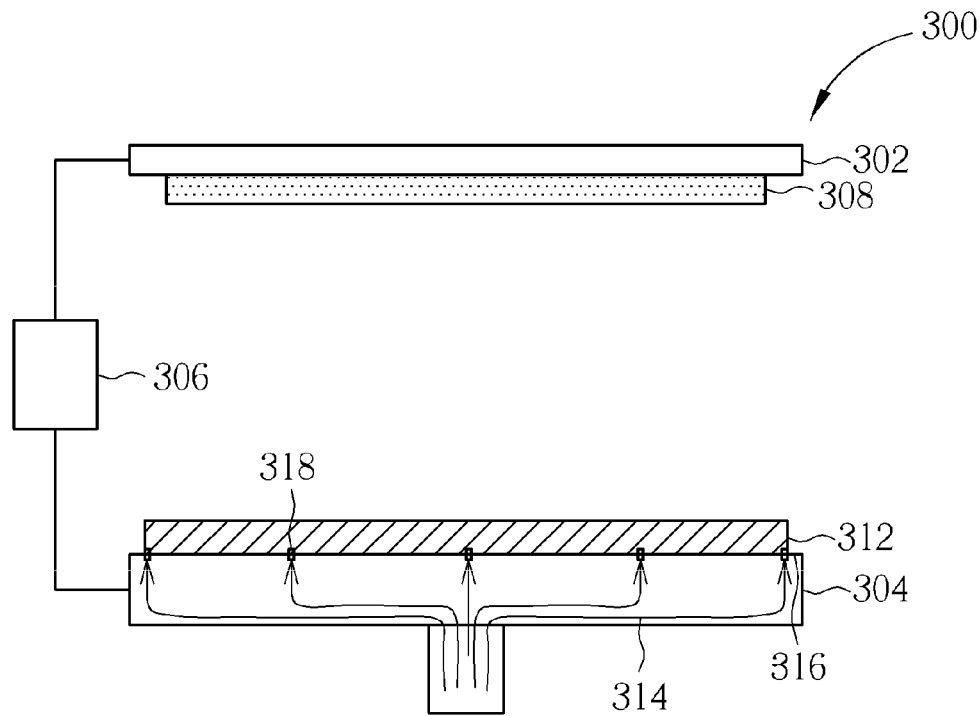

Please refer to FIG. 1 and FIG. 2, which illustrate schematic diagrams of the deposition apparatus according to the present invention. As shown in FIG. 1, the deposition apparatus 300 in the present invention includes a cathode 302 and an anode 304, which are connected to a bias voltage unit 306. The bas voltage unit 306 is able to provide sufficient voltage for the cathode 302 and the anode 304 during the deposition process. A target 308 is disposed on the surface of the cathode 302 to serve as the deposition material. A wafer 312 is disposed on a placing surface 316 on the anode 304. As shown in FIG. 1, a plurality of supporting pins 310 are disposed on the anode 304 to support a wafer 312 during the transportation step in the deposition process. As shown in FIG. 2, the supporting pins 310 can be retracted into the anode 304 such that the wafer 312 can be placed on the placing surface 316. In one embodiment, the anode 304 can further function as a heater to give an appropriate heat environment. The anode 304 can supply a heat transferring gas, such as Ar, to the backside of the wafer 312 through the openings 318 such that the wafer 312 can be heated more evenly and quickly.

Figure 3:
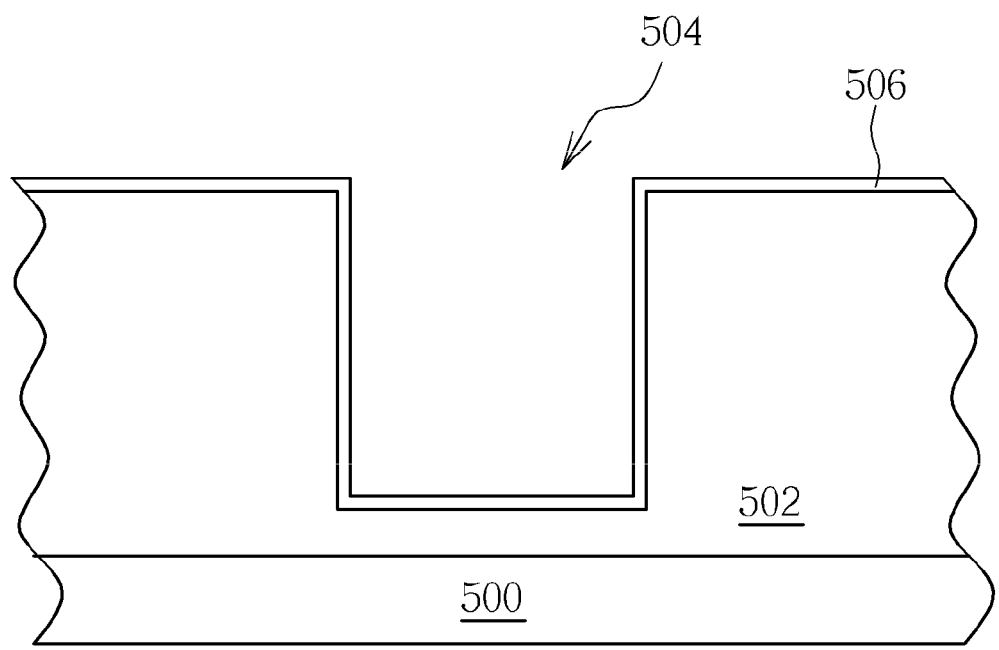
FIG. 3 to FIG. 6 are schematic diagrams of the method for filling a trench with a metal layer in the present invention.

Please refer to FIG. 3 to FIG. 6, which illustrate schematic diagrams of the method for filling a trench with a metal layer according to the present invention. As shown in FIG. 3, a substrate 500 is provided, such as a silicon substrate, a silicon-containing substrate or a silicon-on-insulator (SOI) substrate. Next, a dielectric layer 502 is formed on the substrate 500 and then a trench 504 is formed therein. It is noted that there may be other semiconductor structures between the substrate 500 and the dielectric layer 502: for example, one or a plurality of dielectric layers or metal layers can be formed between the substrate 500 and the dielectric layer 502. A barrier layer 506 can be optionally formed on the substrate 500, such as a Ti/TiN or Ta/TaN layer. The barrier layer 506 covers the surface of the trench 506 but does not completely fill the trench 504.

Figure 4:
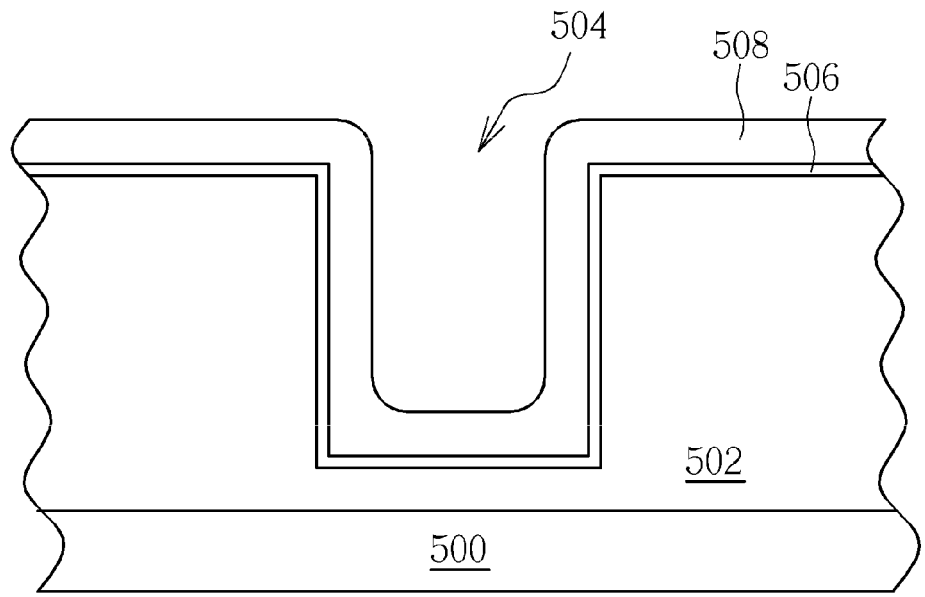

As shown in FIG. 4, a first deposition process is performed to form a metal layer 508 on the surface of the barrier layer 506 in the trench 504. The metal layer 508 is preferably aluminum (Al), but can be other suitable materials such as Ti, Ta, W, Nb, Mo, TiN, TiC, TaN, Ti/W or Ti/TiN, and is not limited thereto. In one preferred embodiment, the first deposition process is performed in the deposition apparatus as shown in FIG. 1. It is one salient feature that the first deposition process is performed from a room temperature to a predetermined temperature and the substrate 300 does not directly contact the placing surface 316 of the anode 304. In detail, the first deposition process is performed right after the substrate 500 is placed onto the supporting pins 310, which are protruding from the placing surface 316, so there is a gap between the substrate 500 and the placing surface 316. Moreover, although the heater anode 304 has the predetermined temperature, since the substrate 500 does not directly contact the placing surface 316 and the heater anode 304 does not provide a heat transferring gas 314, the heater anode 304 and the substrate 500 are not in a thermal equilibrium state, and the temperature of the substrate 500 will not increase sharply but rather will gradually ramp up from the room temperature to the predetermined temperature. It is noted that the room temperature is not a fixed temperature but is changed according to the environment of the deposition apparatus. For example, it may be related to the previous manufacturing step. In practical, the room temperature is lower than 100 degrees Celsius, and preferably lower than 50 degrees Celsius, for example 15 degrees Celsius to 30 degrees Celsius. The predetermined temperature means the temperature when the deposition apparatus is under a steady-state, such as 380 degrees Celsius to 420 degrees Celsius, and preferably 400 degrees Celsius. In one embodiment of the present invention, in the first deposition process, the bias voltage unit 306 of the deposition apparatus 300 supplies a first deposition power, which is substantially between 10,000 W and 15,000 W.

Figure 5:
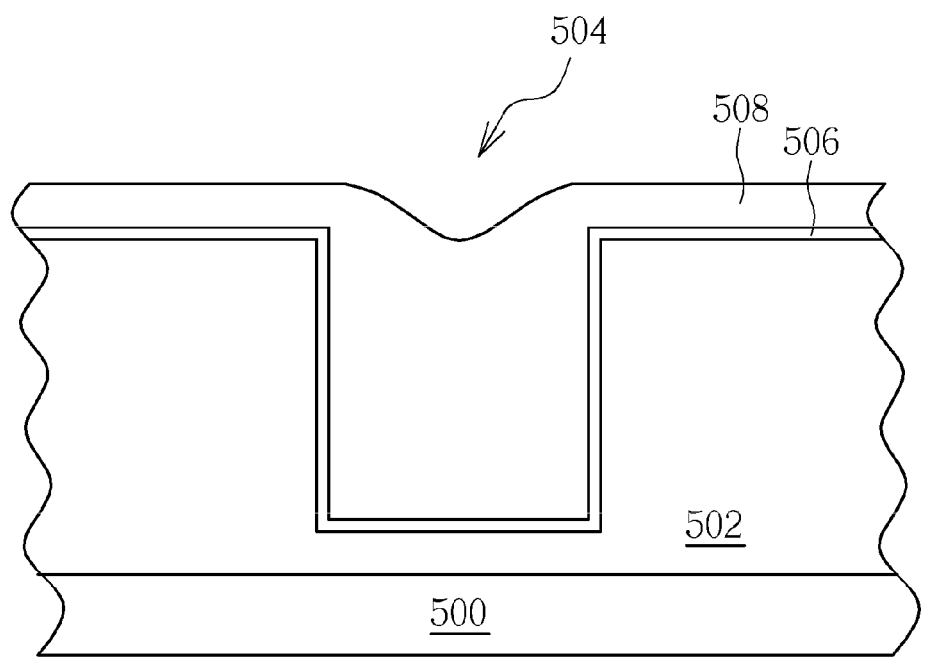

As shown in FIG. 5, when the substrate 500 reaches the predetermined temperature, a second deposition process is performed at once to gradually fill the trench 504 with the metal layer 508. It is another salient feature that, during the second deposition process, the supporting pins 310 will retract back into anode 304 so the substrate 500 is placed onto the placing surface 316, as shown in FIG. 2. Meanwhile, the heater anode 304 supplies a heat transferring gas such as Ar so the heat of the heater anode 304 can be distributed evenly around the substrate 500. In this situation, the substrate 500 and the heater anode 304 are in thermal equilibrium, meaning both temperatures thereof are at or near the predetermined temperature (400 degrees Celsius for example). In one embodiment, in the second deposition process, the bias voltage unit 306 of the deposition apparatus 300 supplies a second deposition power, which is substantially less than or equal to the first deposition power. For example, the second deposition power is substantially between 2,000 W and 10,000 W.

Figure 6:
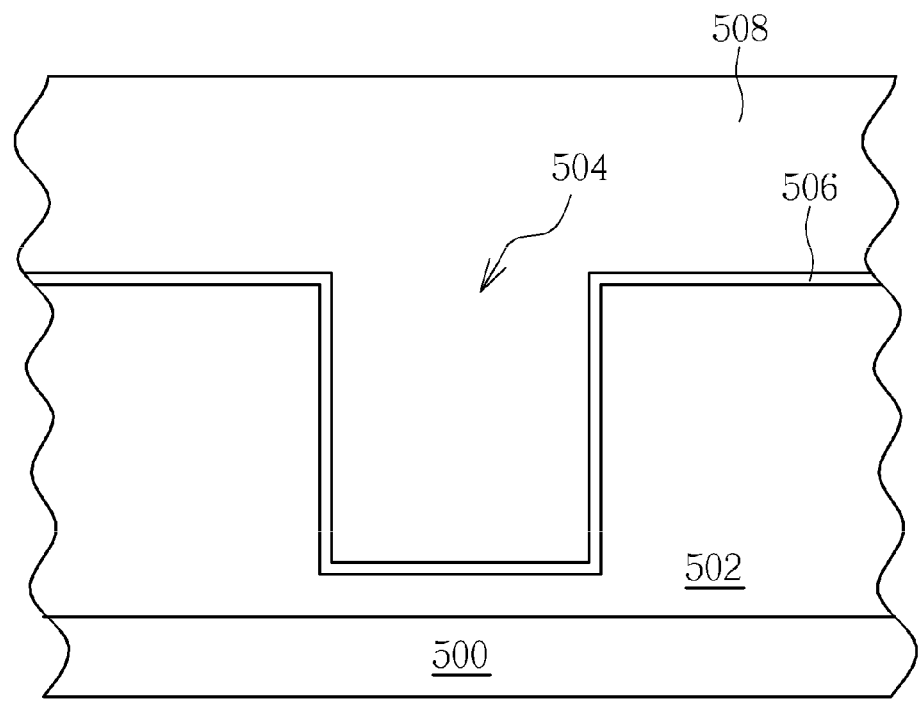

As shown in FIG. 6, after the trench 504 is completely filled with the metal layer 508, a third deposition process can be performed optionally to increase the thickness of the metal layer 508 on the substrate 500. The operation condition of the third deposition process is about the same as that of the second deposition process. One difference is that, in the third deposition process, the bias voltage unit 306 of the deposition apparatus 300 supplies a third deposition power. In one embodiment, the third deposition power is substantially greater than the second deposition power.

After the third deposition process, a reflow process can be optionally performed. In this manner, no deposition is performed but the heater anode 304 maintains the predetermined temperature with a supplement of the heat transferring gas 314. The reflow process is performed for about 15 minutes.

The method for filling the trench with the metal layer includes at least two deposition processes. First, the metal layer 508 is formed by gradually ramping up the temperature so the thermal budget thereof can be decreased and the grain size of the metal layer 508 near the barrier layer 506 can be reduced, thereby obtaining the metal layer 508 with a better quality. Consequently, the spiking phenomenon of the metal layer into the barrier layer can be reduced. In addition, since the lower deposition power is used in the second deposition process, the gap filling ability of the metal layer 508 can be improved so the voids in the trench can be avoided. Lastly, in the third deposition process, since the trench 504 is completely filled with the metal layer 508, a higher deposition power is used to increase the throughput of the method. In one preferred embodiment, a ratio between the thickness of the metal layer 508 formed in the first deposition process and that formed in the second deposition process and the third process is about ½.

In another embodiment, the first deposition process, the second deposition process and the third deposition process can be carried out by a time-mode operation. The time-mode operation can be set in the deposition apparatus 304. For example, when the first deposition process is performed for a first predetermined period, the second deposition process is then carried out. When the second deposition process is performed for a second predetermined period, the third deposition process is then carried out. When the third deposition process is performed for a third predetermined period, the reflow process is then carried out.

As described above, the present invention can provide a metal layer 508 with a better quality which has a smaller grain size and a surface of lower roughness. These features can be shown in the reflectivity. Taking aluminum as an example, the reflectivity of the aluminum can reach up to 1, and maybe even greater than 1.5 or greater than 1.7. It is noted that the "reflectivity" herein preferably means the reflection value under 436 nm by using the machine ASET-F5X provided by the KLA-Tensor company when a barrier layer with 80 angstroms and an aluminum layer with 3000 to 4000 angstroms are formed on a bulk wafer.

The method for filling a trench with a metal layer provided in the present invention can be applied in any process required for filling a metal layer into a trench, such as a mosaic process, a capacitor forming process and even a metal gate process of a planar transistor or a non-planar transistor. Please refer to FIG. 7 to FIG. 11, which illustrate schematic diagrams of the method of forming a metal gate. First, a substrate 400 is provided, such as a silicon substrate, a silicon-containing substrate or a silicon-on-insulator substrate. A plurality of shallow trench isolations (STI) 401 is disposed on the substrate 400. A transistor 402 is formed on the substrate 400 encompassed by the STI 401, such as a PMOS or an NMOS.

Figure 7:
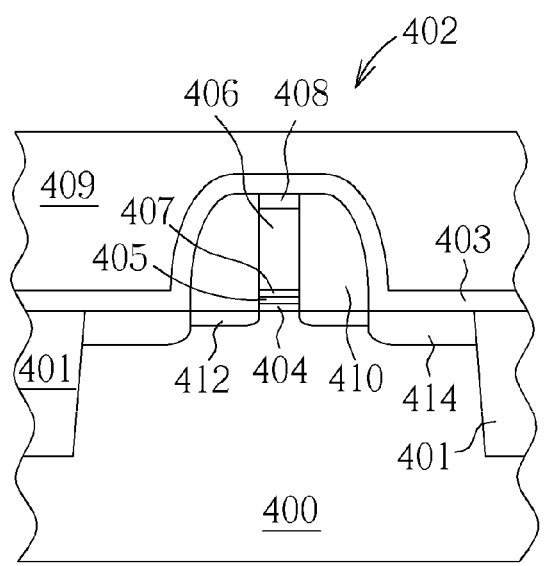
FIG. 7 to FIG. 11 are schematic diagrams of the method of forming a metal gate in the present invention.

In one embodiment shown in FIG. 7, the transistor 402 includes an interface layer 404, a high-k layer 405, an etch stop layer 407, a sacrificial gate 406, a cap layer 408, a spacer 410, a lightly doped drain (LDD) 412 and a source/drain 414. In one preferred embodiment of the present invention, the interface layer 404 can be a $SiO_2$ layer. The high-k layer 405 includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The etch stop layer 407 includes metal/metal nitride, such as TiN. The sacrificial gate 406 is a poly-silicon gate. In another embodiment, the sacrificial gate 406 is a multi-layered gate including a poly-silicon layer, an amorphous silicon layer or a germanium layer. The cap layer 408 can be a SiN layer, for example. The spacer 410 can be a multi-layered structure including high temperature oxide (HTO), SiN, SiO or SiN formed by hexachlorodisilane ($Si_2Cl_6$) (HCD-SiN). The first LDD 412 and the first source/drain 414 are formed by appropriate dopants implantation. After forming the transistor 402, a contact etch stop layer (CESL) 403 and an inter-layer dielectric (ILD) layer 409 are formed on the substrate 400 to cover the transistor 402.

Figure 8:
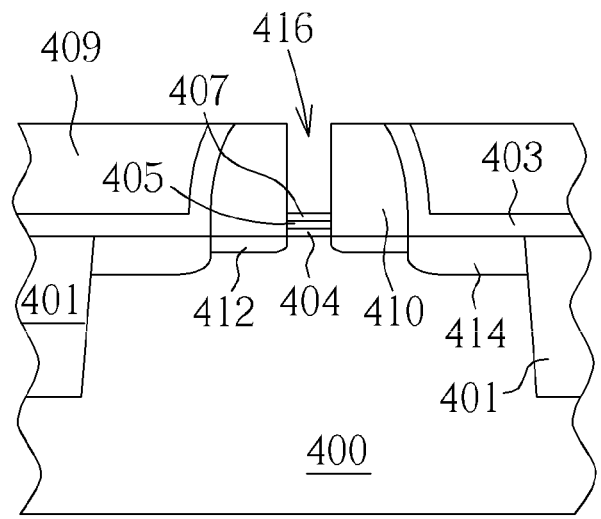

As shown in FIG. 8, a planarization process, such as a chemical mechanical polish (CMP) process, an etching-back process or a combination thereof is performed to remove a part of the ILD layer 409, a part of the CESL 403, a part of the spacer 410 and completely remove the cap layer 408, until the top surfaces of the sacrificial gate 406 are exposed. Thereafter, a wet etching process and/or a dry etching process is performed to remove the sacrificial gate 406 until the etch stop layer 407 is exposed. A trench 416 is formed in the transistor 402.

Figure 9:
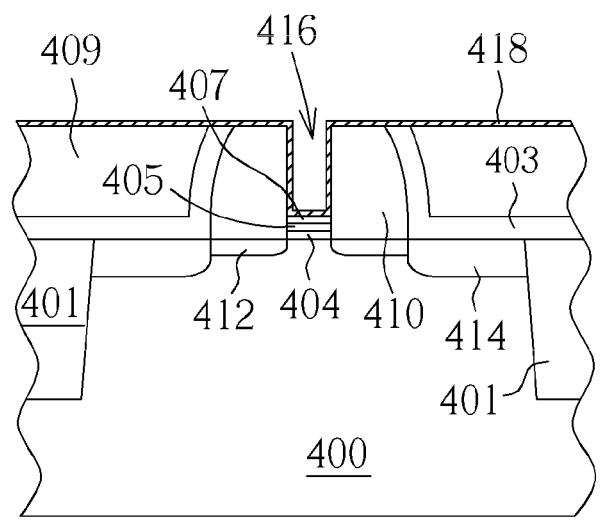

As shown in FIG. 9, a work function metal layer 418 is formed on the substrate 400. The material of the work function metal layer 418 can be adjusted according to the type of the transistor 412. If the transistor 412 is a PMOS, the work function metal layer 418 includes Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. If the transistor 412 is an NMOS, the work function metal layer 418 includes TiAl, ZrAl, WAl, TaAl or HfAl, but should not be limited thereto. In one embodiment, before forming the work function metal layer 418, a bottom barrier layer (not shown) can optionally be formed, such as a TaN layer.

Figure 10:
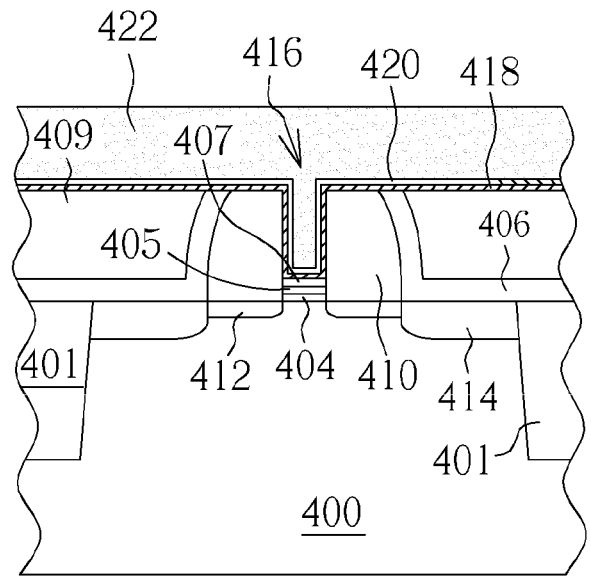

As shown in FIG. 10, an optional top barrier layer 420 and a metal layer 422 can be formed on the substrate 400. The metal layer 422 can be formed by the method shown in FIG. 3 to FIG. 6, so as to obtain the metal layer with a better quality.

Figure 11:
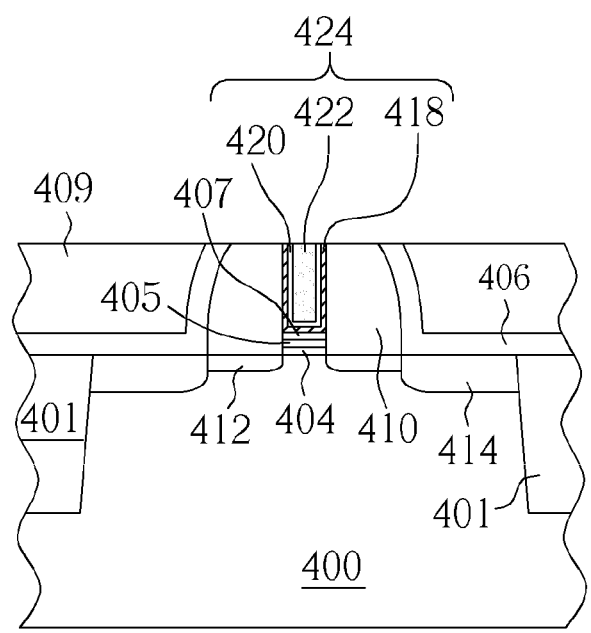

Lastly, as shown in FIG. 11, a planarization process is carried out to remove the metal layer 422, (barrier layer 420), and the work function metal layer 418 outside the trench 416, so a metal gate 424 including the metal layer 422, (the barrier layer 420) and the work function metal 418 is therefore formed.

As stated in the above, the present invention provides a method for filling a trench with a metal layer and a semiconductor structure formed by using the same. The method can be applied to the manufacturing method of a metal gate. The present invention provides a method including at least two deposition processes to fill the trench with the metal layer, which is able to respectively overcome the conventional problems and therefore obtain the metal layer with a better quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
 a substrate;
 a dielectric layer disposed on the substrate, wherein the dielectric layer has a trench; and
 an aluminum layer completely filled into the trench, wherein a reflectivity of the aluminum layer is substantially greater than 1.

2. The semiconductor device according to claim 1, further comprising at least a barrier layer disposed between the dielectric layer and the aluminum layer.

3. The semiconductor device according to claim 2, wherein the barrier layer comprises Ti/TiN or Ta/TaN.

4. The semiconductor device according to claim 1, wherein the semiconductor device is a transistor and the aluminum layer is a part of the gate of the transistor.

5. The semiconductor device according to claim 4, wherein the transistor further comprises a gate dielectric layer disposed between the aluminum layer and the substrate, and a source/drain region disposed in the substrate at two sides of the aluminum layer.

* * * * *